Dec. 29, 1970 R. N. WOODWARD ET AL 3,551,150

PROCESS FOR PRODUCING LITHOGRAPHIC PLATES COMPRISING ETCH BLEACHING, ETCHING AND COPPERIZING

Filed July 3, 1967

ROBERT N. WOODWARD
JOSEPH T. LEONE
INVENTORS

BY Henry E. Byers

ATTORNEY

United States Patent Office 3,551,150

Patented Dec. 29, 1970

3,551,150

PROCESS FOR PRODUCING LITHOGRAPHIC PLATES COMPRISING ETCH BLEACHING, ETCHING AND COPPERIZING

Robert N. Woodward and Joseph T. Leone, Rochester, N.Y., assignors to Eastman Kodak Company, Rochester, N.Y., a corporation of New Jersey Filed July 3, 1967, Ser. No. 650,681
Int. Cl. G03c 5/38
U.S. Cl. 96—36 9 Claims

ABSTRACT OF THE DISCLOSURE

A photographic element comprising a metal support such as aluminum having thereon an abutting gelatin silver halide emulsion having a melting point above about 180° F. is exposed, developed and processed using an etch bleach process followed by a deep etch of the support. The support is then copperized and the emulsion removed to provide a lithographic printing plate.

This invention is concerned with photographic elements, their preparation and use. In one aspect, this invention relates to an element comprising a metal support having thereon a photographic silver halide emulsion. In another aspect, this invention relates to the formation of a lithographic plate using an etch bleach process to form a resist which is used to obtain a deep etch plate.

It is known that lithographic printing plates can be prepared directly from photographic elements comprising light sensitive silver halide layers. However, photographic elements which use light sensitive silver halide emulsions have, in the past, generally employed unhardened silver halide gelatin emulsion layers which are exposed and developed using a hardening developer. This developer hardens the photographic silver halide emulsion in the exposed areas and the unhardened areas can then be removed by washing with warm water. The resulting plate can then be used on a lithographic printing press. However, such printing plates are often subjected to extensive abrasion and wear when used on a lithographic press and, therefore, exhibit a relatively short press life.

It has been known also to prepare lithographic plates having a relatively longer press life by what is known as a deep etch process. In such a process a light sensitive material such as a light sensitive resin is used to form a resist on a metal support. The light sensitive material on a metal support is exposed and developed by using a solvent which removes the material in the image areas forming a resist area on the metal surface. This area is then treated with a deep etch solution which etches or dissolves the metal at the surface. The etched plate is then treated with a material which deposits another metal or similar material in the etched areas after which the resist is removed from the plate. This plate is used for relatively long lithographic runs.

It would be desirable to use silver halide emulsions to prepare deep etch lithographic plates in order to take advantage of the higher speeds of such emulsions and also obtain plates exhibiting a relatively long press life.

Accordingly, it is an object of this invention to provide a photographic element which can be processed using a combination of etch bleach and deep etch treatments to obtain a high quality, long run lithographic plate. Another object of this invention is to provide a means for obtaining good quality lithographic printing plates in a convenient, economical and rapid manner. Another object of this invention is to provide a novel photographic element which is particularly adapted to the preparation of a lithographic printing plate. It is another object of this invention to provide a photographic element in which a light sensitive silver halide layer is coated directly over a metal support such as aluminum, which element can be processed to form a high quality lithographic printing plate. Still another object of this invention is to provide a process for obtaining a surface exhibiting excellent ink-water differential by subjecting a photographic element comprising a metal support having thereon a hardened silver halide emulsion to an etch bleach process followed by a deep etch process and copperizing. A further object of this invention is to provide a lithographic printing plate which is particularly adapted to processing by automation. Other objects of this invention will become apparent from an examination of the specification and claims which follow.

In accordance with this invention, it has been found that a good quality, long run lithographic plate can be prepared by a process which combines etch bleach and deep etch processing steps. Furthermore, the use of a novel photographic element comprising a metal support and a silver halide emulsion layer having a high degree of hardness, i.e. a melting point above about 180° F., as described herein, gives particularly good results in the practice of this invention.

One embodiment of this invention relates to a process which comprises (1) etch bleaching silver image areas in a gelatin layer coated on a metal support and (2) etching said support in said image areas.

Another embodiment of this invention relates to a process which comprises (1) etch bleaching silver image areas in a gelatin layer coated on a metal support, (2) etching said support in said image areas, (3) copperizing said support in said etched areas and (4) removing gelatin from areas of said support which have not been etched.

Still another embodiment of this invetnion relates to a photographic element comprising a metal support having thereon an abutting gelatin photographic silver halide emulsion layer having a melting point above about 180° F.

The drawing shows one embodiment of this invention:

FIG. 1 shows a support 10 having thereon a gelatin silver halide emulsion 12 with a latent image 14 in the silver halide emulsion 12.

Figure 1:
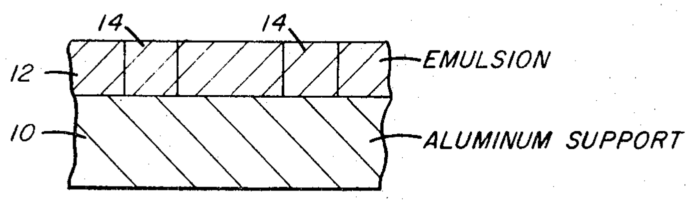
Figure 2:
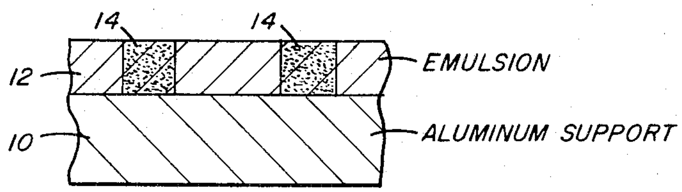
FIG. 2 shows the same photographic element of FIG. 1 after development of image 14 to silver with a silver halide developer.
Figure 3:
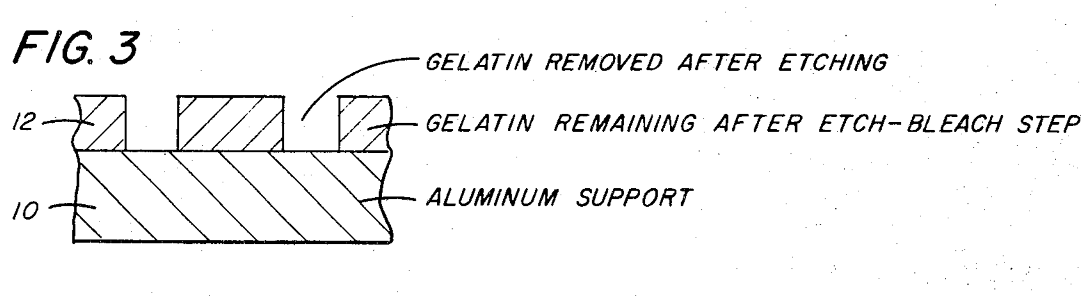
FIG. 3 shows the image areas 14 which have been removed by the etch bleach step with the unaffected gelatin 12 remaining.
Figure 4:
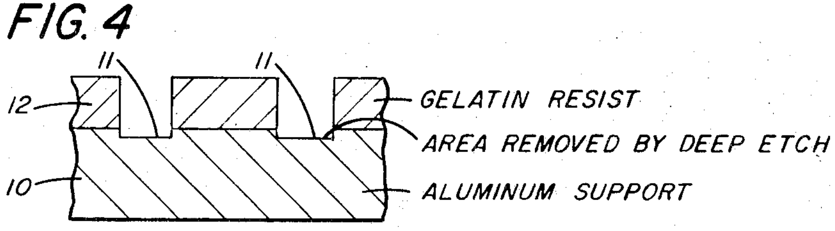
FIG. 4 shows the element after it has been treated with a deep etch solution to etch the metal areas 11 in image areas 14.
Figure 5:
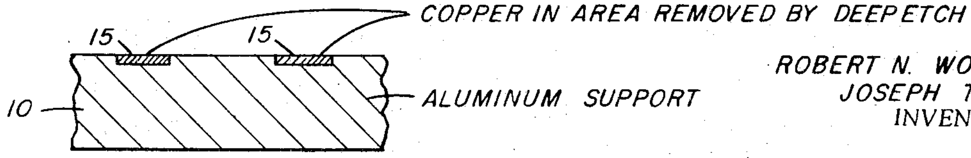
FIG. 5 shows the final lithographic plate after the areas which have been etched into the metal have been filled with copper and the gelatin resist 12 has been removed.

In practicing this invention, an exposed and developed photographic element, as described herein, is contacted with an etch bleach bath. A typical etch bleach bath or solution contains an oxidizing agent such as hydrogen peroxide, an insoluble silver salt former such as chloride ion and a metal ion catalyst such as cupric ion. A gelatin softener such as citric acid and/or urea is often used in an etch bleach bath. The etch bleach reaction takes place in the areas where silver has been formed resulting in bleaching silver image and at the same time degrading or etching gelatin in these same areas. After the image areas are etch bleached, the undeveloped emulsion remains. If desired, the emulsion can then be reexposed and then redeveloped to provide a dark image in those areas which are not etched. This provides an image area for proofing purposes on the plate. However, if desired, the plate can be dried immediately following the etch bleach operation and treated with a deep etch solution to etch into the metal support.

The deep etch solution is applied to the plate for a sufficient time to permit the etch to eat into the metal support in order to provide a deep enough etch area to receive a material having ink receptivity which is different from the metal support. For example, copper can be deposited in the deep etched areas by a suitable copperizing process. When an anodized aluminum plate is used the etching period is long enough to cut through the aluminum oxide layer. When unanodized aluminum is used, the time is sufficient to allow penetration of the solution through any surface coatings or oxidized surface layer to aluminum. The step of copperizing can merely involve treating the metal plate, preferably aluminum or zinc, with a copper salt such as cupric chloride. If the etched area has not been deep enough, the copper does not adhere and the etching step must be repeated. After copper has been deposited in the image areas, the gelatin resist is removed with an oxidizing agent such as sodium hypochlorite. A metal plate such as aluminum with a copper image thereon remains and can then be used for printing on a lithographic press. The aluminum areas are hydrophilic whereas the copepr image is oleophilic to greasy printing ink.

In a prepared procedure, an anodized aluminum sheet is used as a support. Over the aluminum is coated a high contrast projection speed silver halide emulsion which is exposed to a light image and developed in a developer such as Kodak Developer D–85. Following development, the silver halide emulsion is immersed in an etch bleach bath such as Kodak Etch Bleach Bath EB–4 containing cupric chloride, citric acid, urea and hydrogen peroxide. This results in bleaching silver grains and at the same time degrading or softening gelatin so that it is removed in the image areas. The plate is deep etched in a ferric chloride-hydrochloric acid bath and then dehydrated with alcohol. The image area is copperized with cupric chloride and the gelatin resist removed with sodium hypochlorite. The resulting lithographic plate is then inked and placed on a lithographic press.

The photographic silver halide emulsions which can be used in the practice of this invention include silver halide emulsions such as silver chloride, silver bromide, silver iodide, silver chlorobromide, silver chloroiodide, silver bromoiodide, silver chlorobromoiodide, etc. A particularly useful emulsion is a high contrast silver halide emulsion in which the halide comprises at least 60 mole percent silver chloride.

The photographic silver halide layer employed in the practice of this invention is a gelatin photographic silver halide emulsion layer. It is preferred to use gelatin as a sole binding agent for the silver halide although other photographic binding agents for example hydrophilic colloids, proteinaceous materials and the like, can be used to replace a part of the gelatin. Suitable binding materials which can be used with gelatin include for example, cellulose derivatives, synthetic resins, particularly polyvinyl compounds and the like, water insoluble polymerizable vinyl compounds, particularly those known to improve dimensional stability can also be included, as exemplified by water soluble polymers of alkyl acrylate, methacrylate and the like.

The coverage of the silver halide emulsion can be varied within a very wide range. A useful range is about 100–800 mg. per square foot of gelatin, preferably 100–400 mg. per square foot and about 50–200 mg. per square foot of silver as silver halide, preferably 50–125 mg. per square foot. The photographic emulsions described herein can be chemically sensitized such as with compounds of the sulfur group, noble metal salts such as gold salts, reduction sensitized with reducing agents, combinations of these, etc. Furthermore, the emulsion and other layers can be hardened with any suitable hardener such as aldehyde hardeners, aziridine hardeners, hardeners which are derivatives of dioxane, oxypolysaccharides, such as oxystarch, oxy plant gums and the like.

The photographic silver halide emulsions can also contain additional additives particularly those known to be beneficial in photographic emulsions, including for example, stabilizers or antifoggants, particularly the water soluble inorganic acid salts of cadmium, cobalt, manganese and zinc as disclosed in U.S. Pat. 2,839,405, substituted triazaindolines as disclosed in U.S. Pats. 2,444,605 and 2,444,607, speed increasing materials, plasticizers, absorbing dyes and the like. Sensitizers which give particularly good results in typical emulsions useful in our invention are the alkylene oxide polymers which can be employed alone or in combination with other materials such as quaternary ammonium salts as disclosed in U.S. Pat. 2,886,437 or with mercury compounds and nitrogen containing compounds as disclosed in U.S. Pat. 2,751,299. The emulsions can be blue sensitized, orthochromatic, panchromatic, infrared sensitive, etc.

The silver halide emulsions used in practicing this invention include both negative and positive emulsions. Suitable positive emulsions which can be used include direct positive emulsions such as (1) hardened solarizing silver halide emulsions and (2) hardened internal latent silver halide emulsions forming the latent image mostly inside the silver halide grains.

The solarizing direct positive silver halide emulsions are silver halide emulsions which have been effectively fogged either chemically or by radiation, to a point which corresponds approximately to the maximum density of the reversal curve as shown by Mees, The Theory of the Photographic Process, published by Macmillan Co., New York, N.Y., 1942, pages 261–297.

Typical methods for the preparation of solarizing emulsions are shown by Groves, British Pat. 443,245, Feb. 25, 1936 which describes subjecting an emulsion to roentgen rays "until the emulsion layer, when developed without additional exposure, is blackened up to the apex of its gradation curve"; Szaz, British Pat. 462,730, Mar. 15, 1937, the use of either light or chemicals such as silver nitrate, organic sulfur compounds and dyes to convert ordinary silver halide emulsions to solarizing direct positive emulsions; Arens, U.S. Pat. 2,005,837, June 25, 1935, the use of silver nitrate and other compounds in conjunction with heat to effect solarization of the silver halide, and Leermakers U.S. Pat. 2,184,013, the use of large concentrations of non-acid optical sensitizing dyes and reducing agents to effect solarization.

Kendall and Hill, U.S. Pat. 2,541,472, Feb. 13, 1951, shows useful solarizing emulsions particularly susceptible to an exposure with long wavelength light to produce a Herschel effect described by Mees above, produced by adding nitro-substituted electron acceptors and other compounds to the emulsion which is fogged either chemically or with white light.

In using solarizing emulsions, a sufficient reversal image exposure is employed using minus blue light of from about 500–700 millimicrons wavelengths, preferably 520–540 millimicrons to substantially destroy the latent image in the silver halide grains in the region of the image exposure.

Conventional silver halide developing solutions can be used to develop a direct positive image in solarizing emulsions.

The internal latent image direct positive silver halide emulsions used in this invention include those well known in the art which upon exposure form the latent image mostly inside the silver halide grains, the direct positive properties of the emulsions being attributable to the crystalline structure of the silver halide grains. That is, a number of authorities in the field of photography have shown that there are imperfections or flaws, in the crystal structure (on the surface or internally) of silver halide which is used in photography, at which flaws the latent image forms by trapping photoelectrons to give development centers. Development, therefore, commences at the sites of these flaws. Journal of Photographic Science. "Photographic Sensitivity," text of a lecture given on July 1, 1957, by J. W. Mitchell; vol. 6, No. 3 (1958).

Other photographic reversal emulsions may be used including those containing grains comprising a central core of a water insoluble silver salt containing centers which promote the deposition of photolytic silver and an outer shell or covering for such core of a fogged or spontaneously developable water insoluble silver salt. The fogged shell of such grains is developed to silver without exposure. Emulsions of this type are described in Berriman, U.S. patent application Ser. No. 448,467 filed Apr. 15, 1965.

Before the shell of water insoluble silver salt is added to the silver salt core, the core emulsion is first chemically or physically treated by methods previously described in the prior art to produce centers which promote the deposition of photolytic silver, i.e. latent image nucleating centers. Such centers can be obtained by various techniques as described in the prior art. Chemical sensitization techniques of the type described by Antoine Hautot and Henri Saubenier in Science et Industries Photographiques, vol. XXVIII, January 1957, pages 57–65, are particularly useful. Such chemical sensitization includes three major classes, namely, gold or noble metal sensitization, sulfur sensitization, such as labile sulfur compound and reduction sensitization, i.e., treatment of the silver halide with a strong reducing agent which introduces small specks of metallic silver into the silver salt crystal or grain.

The core emulsions can be chemically sensitized by any method suitable for this purpose. For example, the core emulsions can be digested with naturally active gelatin, or sulfur compounds can be added to those described in Shepard, U.S. Pat. 1,574,944, issued Mar. 2, 1926, Shepard et al., U.S. Pat. 1,623,499, issued Apr. 5, 1927 and Shepard et al., U.S. Pat. 2,410,689, issued Nov. 5, 1946.

The core emulsions can also be chemically sensitized with gold salts as described in Waller et al., U.S. Pat. 2,399,083 issued Apr. 23, 1946 and Damschroder et al., U.S. Pat. 2,642,361 issued June 16, 1953. Suitable compounds are potassium chloroaurite, potassium aurithiocyanate, potassium chloroaurate, aurictrichloride and 2-aurosulfobenzothiazole methylchloride.

The core emulsions can also be chemically sensitized with reducing agents, such as stannous salts (Carroll, U.S. Pat. 2,487,850, issued Nov. 15, 1949), polyamines such as diethylenetriamine (Lowe and Jones, U.S. Pat. 2,618,598, issued Aug. 15, 1950), polyamines such as spermine (Lowe and Allen, U.S. Pat. 2,521,925, issued Sept. 12, 1950) or bis(beta-aminoethyl)sulfide and its water soluble salts (Lowe and Jones, U.S. Pat. 2,521,926, issued Sept. 12, 1950).

The shell of the grains comprising the emulsions used in practicing this invention is prepared by precipitating over the core grains a light sensitive water insoluble silver salt that can be fogged and which fog is removable by bleaching. The shell is of sufficient thickness to prevent access of the developer used in processing the emulsions of the invention to the core. The silver salt shell is surface fogged to make it developable to metallic silver with conventional surface image developing compositions. The silver salt of the shell is sufficiently fogged to produce a density of at least about 0.5 when developed for 6 minutes at 68° F. in Developer A below when the emulsion is coated at a silver coverage of 100 mg. per square foot.

DEVELOPER A

N-methyl-p-aminophenol sulfate—2.5 grams
Ascorbic acid—10.0 grams
Potassium metaborate—35.0 grams
Potassium bromide—1.0 gram
Water—to 1.0 liter
pH of 9.6

Such fogging can be effected by chemically sensitizing to fog with the sensitizing agents described for chemically sensitizing the core emulsion, high intensity light and like fogging means well known to those skilled in the art. While the core need not be sensitized to fog, the shell is fogged, for example, reduction fogged with a reducing agent such as stannous chloride. Fogging by means of a reduction sensitizer, a noble metal salt such as gold salt plus a reduction sensitizer, high pH and low pAg silver halide precipitating conditions, and the like can be suitably utilized. The shell portion of the subject grains can also be coated prior to fogging.

Another direct positive silver halide emulsion which can be used is a fogged direct positive silver halide emulsion comprising fogged silver halide grains which have a uniform diameter frequency distribution, i.e. silver halide grains which have substantially uniform diameter. In one embodiment of this type of emulsion, the direct positive photographic emulsion comprises fogged silver halide grains, at least 95% by weight of said grains having a diameter which is within about 40% of the mean grain diameter. Preferably, photographic emulsions of this type comprise reduction and gold fogged silver halide grains and a compound which accepts electrons. The use of low concentrations of reduction and gold fogging agents, in preparing such emulsions gives unique fogged silver halide grains which are characterized by a very high photographic speed in conventional photographic processing solutions.

To increase sharpness, it may be desirable to include an antihalation pigment or dye in the emulsion. Typical dyes and pigments used in antihalation layers may be used provided they are inert to the emulsion and do not affect the etch bleach reaction. In a preferred embodiment, a carbon pigment is used. A useful amount of antihalation dye or pigment is 20 to 50 grams per silver mole.

Gelatin photographic silver halide layers which are subjected to etch bleaching according to the practice of this invention are preferably hardened emulsion layers and in a preferred case, an emulsion layer hardened to the point where it has a melting point above about 180° F., generally above about 200° F. and preferably above about 230° F. For most applications, the melting point of this layer does not exceed about 300° F.

When the gelatin photographic silver halide layer is hardened to a point where it exhibits a melting point of at least 180° F., the lithographic plate obtained by the process described herein exhibits outstanding printing characteristics as illustrated by exceptional fine-line detail in the printed image. In contrast, a plate prepared using an unhardened gelatin photographic silver halide layer or one hardened to a lesser degree, e.g. one having a melting point of only about 150° F., gives significantly inferior fine-line detail in comparison. The gelatin photographic silver halide layers which are etch bleached according to the practice of this invention, can be coated as the adjacent layer to the metal support, i.e. as an abutting layer. The metal can be treated, e.g. with subbing, cleaning or other surface modifying composition to form a metal support upon which the abutting gelatin photographic silver halide layer is coated. A particularly desirable metal support is anodized aluminum. For some applications, it may be desirable to have other layers between the silver halide layer and the metal support. Such layers include for example, antihalation layers and the like. It will be, of course, understood that such layers must be capable of being eaten away by deep etching as described herein. Furthermore, the gelatin photographic silver halide layers can be overcoated with layers such as very thin gelatin layers containing Carey Lea silver or other layers which can be eaten away during the etch bleaching operation.

It will be appreciated that any silver halide developing agent can be used in the practice of this invention. Such developing agents can be incorporated into the element contiguous to silver halide, e.g. in the emulsion layer or in a contiguous layer. Typical developing agents include hydroquinone and substituted hydroquinones such as bromohydroquinone, chlorohydroquinone, toluhydroquinone, morpholinomethylhydroquinone, etc. It will also be appreciated that an auxiliary developing agent can be used in an amount of 0 to 20%, by weight, of the hydroquinone or substituted hydroquinone in order to improve the speed without affecting the developing reaction.

Typical auxiliary agents include 3-pyrazolidone developing agents known in the art as well as Elon (N-methyl-p-aminophenol sulfate) and the like. Particularly useful auxiliary agents are 1-phenyl-3-pyrazolidone and 1-phenyl-4,4-dimethyl-3-pyrazolidone.

Anodized aluminum is a particularly useful support in the practice of our invention. Prior to anodizing, the aluminum is cleaned, preferably with a fluoride solution such as ammonium bifluoride. It will be appreciated that other supports can be used including metal such as zinc, steel and the like. Particularly useful materials are those known as bimetallic plates which conventionally have two metals such as copper and aluminum, chromium and copper, etc., one coated over the other. During the deep etch step, the top metallic layer is etched through to the second metal to provide a difference in ink-water affinity. It will be appreciated that the choice of support will depend upon the durability, availability and cost of the support material.

The developed silver halide emulsion is processed to a lithographic plate with an etch bleach solution. As previously indicated, etch bleach solutions typically contain an oxidizing agent such as hydrogen peroxide, an insoluble silver salt former such as chloride ion and a metal ion catalyst such as cupric ion. A gelatin softener such as citric acid and/or urea may also be incorporated in an etch bleach solution. The etch bleach solution can be applied by spraying, dipping, immersing, swabbing, etc. to the areas where silver has been formed resulting in bleaching silver image and at the same time degrading or etching gelatin in these same areas. The etch bleach application normally removes the gelatin in the image area. However, the emulsion may be washed to remove the etch bleach solution and any remaining softened colloid.

If desired, the emulsion can then be reexposed to regular roomlight and then redeveloped to provide an image in those areas which were not etched. In certain instances, it may be desirable to harden the emulsion after the etch bleach operation. However, this generally is not necessary. The image may be colored by dye or pigment following bleach operations, if a visible image is desired.

The etch bleach solution may be one of those containing cupric chloride, citric acid and hydrogen peroxide, such as Kodak Etch Bleach Bath EB–3 or EB–4, as follows:

KODAK ETCH BLEACH BATH EB–3

Water, at 125° F.—750 cc.
Cupric chloride—10 g.
Citric acid—10 g.
Water to make—1 liter
Hydrogen peroxide 3%—1 liter

KODAK ETCH BLEACH BATH EB–4

Water, at 125° F.—600 cc.
Cupric chloride—10 g.
Citric acid—150 g.
Urea—150 g.
Water to make—1 liter
Hydrogen peroxide 3%—1 liter Another suitable etch bleach bath containing copper sulfate, citric acid, potassium bromide and hydrogen peroxide is known as Kodak Etch Bleach Bath EB–2. However, an etch bleach bath containing cupric chloride, citric acid, urea and hydrogen peroxide in which there is at least 20 grams per liter of cupric chloride is particularly suitable in producing a clean removal of the gelatin in the image areas in a period of time as short as 20 seconds. Such etch bleach solutions are described in application Ser. No. 650,616, filed concurrently herewith. Various other oxidizing compounds may be used in place of hydrogen peroxide such as hydrogen peroxide precursors and the like. However, oxidixing agents which are used in place of hydrogen peroxide must be those which act selectively on the image area where the silver image is located rather than attacking the complete emulsion layer which would be the case, for example, if nitric acid was utilized.

The deep etch solutions which are employed in the practice of this invention include those well known in the art. A hydrochloric acid-ferric chloride solution is preferred. However, other acid-salt solutions can be used depending upon the metals to be etched. Typical deep etch solutions are disclosed in Photomechanics and Printing, Mertle Publishing Co., Chicago, Ill. (1957), pages 295 and 296.

The following examples are intended to illustrate our invention but not to limit it in any way:

Example 1

A grained, fluoride treated and anodized aluminum support is coated with a hardened high contrast silver chlorobromide emulsion having a melting point of 250° F. coated to yield a silver coverage of 190 mg. per square foot.

The element is exposed from a film negative and developed in Kodak D–85 developer for two minutes at 68° F. After development, the plate is etch bleached in a solution of the following composition for 60 seconds to form a gelatin resist:

5 grams cupric chloride
75 grams citric acid
75 grams urea

All dissolved in one liter of 1½% hydrogen peroxide.

The plate is then rinsed with water and subjected to deep etch processing using a ferric chloride-hydrochloric acid.

After the deep etch step, the plate is copperized by treating with cupric chloride and the gelatin resist is then removed with sodium hypochlorite. The aluminum plate with a copper image is placed on a lithographic printing press and used for printing. The printed image exhibits excellent fine-line detail.

When the above procedure is repeated using a hardened silver chlorobromide emulsion layer having a melting point of 160° F., the printed image is acceptable but the fine-line detail is quite inferior.

Example 2

Example 1 is repeated except that after the deep etch step, the plate is lacquered, the resist removed as in Example 1 and the plate used for printing to obtain a good quality print.

Example 3

Example 1 is repeated except that the aluminum support is grained and treated with ammonium fluoride instead of anodized. Excellent printing results are obtained as in Example 1.

The invention has been described in detail with particular reference to preferred embodiments thereof, but it will be understood that variations and modifications can be effected within the spirit and scope of the invention as described hereinabove and as defined in the appended claims.

We claim:

1. A process for obtaining a lithographic printing plate comprising (1) etch bleaching silver image areas in a gelatin layer coated on a metal lithographic support with a solution containing a peroxide oxidizing agent, cupric chloride, and citric acid, (2) etching said support in said image areas, (3) copperizing said support in said image areas with cupric chloride and (4) removing remaining gelatin from said support with sodium hypochloride.

2. A process according to claim 1 in which said gelatin layer is a hardened gelatin layer having a melting point above about 180° F.

3. A process according to claim 1 in which said support is an aluminum support.

4. A process according to claim 1 in which said support is a zinc support.

5. A process according to claim 1 in which said support is a bimetallic support.

6. A process according to claim 1 in which said support is an anodized aluminum support.

7. A process according to claim 1 in which said support is an anodized aluminum support and said gelatin layer has a melting point above about 180° F.

8. A process according to claim 1 in which said gelatin layer abuts said support.

9. A process according to claim 8 in which said support is aluminum and said gelatin layer has a melting point above about 180° F.

References Cited

UNITED STATES PATENTS

| | | | |
|---|---|---|---|
| 2,013,116 | 9/1935 | Troland | 96—33 |
| 2,115,339 | 4/1935 | Mason | 96—86 |
| 2,676,886 | 4/1954 | Barbarite | 96—33 |
| 3,003,413 | 10/1961 | Taylor et al. | 96—33 |
| 3,348,948 | 10/1967 | Leonard et al. | 96—75 |
| 2,766,119 | 10/1956 | Freedman et al. | 96—86 |

GEORGE F. LESMES, Primary Examiner

J. P. BRAMMER, Assistant Examiner

U.S. Cl. X.R.

96—33, 36.3, 86